United States Patent [19]
Iwata

[11] Patent Number: 4,754,419
[45] Date of Patent: Jun. 28, 1988

[54] ADAPTIVE DIGITAL FILTER

[75] Inventor: Yoshihiro Iwata, Tokyo, Japan

[73] Assignee: Hitachi Denshi Kabushiki Kaisha, Tokyo, Japan

[21] Appl. No.: 789,702

[22] Filed: Oct. 21, 1985

[30] Foreign Application Priority Data

Oct. 25, 1984 [JP] Japan ................. 59-223012

[51] Int. Cl.⁴ .................................. G06F 7/38
[52] U.S. Cl. ..................................... 364/724
[58] Field of Search ............ 364/724, 734, 572; 375/11–15; 333/18

[56] References Cited

U.S. PATENT DOCUMENTS

| | | | |
|---|---|---|---|
| 3,868,603 | 2/1975 | Guidoux | 333/18 |
| 4,196,405 | 4/1980 | Le Dily et al. | 333/16 |
| 4,303,895 | 12/1981 | Ohnishi et al. | 333/18 |
| 4,349,889 | 9/1982 | Vanden Elzen et al. | 364/724 |
| 4,438,521 | 3/1984 | Mattei | 375/16 |
| 4,456,893 | 6/1984 | Otani | 333/18 |
| 4,550,415 | 10/1985 | Debus, Jr. et al. | 375/14 |

Primary Examiner—Gary V. Harkcom
Assistant Examiner—Tan V. Mai
Attorney, Agent, or Firm—Blakely, Sokoloff, Taylor & Zafman

[57] ABSTRACT

In an adaptive digital filter having a digital filter for simulating a transmission system having indeterminate transmission characteristics through a series circuit of a plurality of series-connected delay circuits, and a correction circuit for correcting the output signal from the digital filter in accordance with changes in transmission characteristics of the transmission system, an input signal to and an output signal from the series circuit of the delay circuits are squared. The difference between the square signals is divided by the number of the delay circuits to obtain a mean value. When the mean value exceeds a predetermined value, the operation of the correction circuit is inhibited.

3 Claims, 2 Drawing Sheets

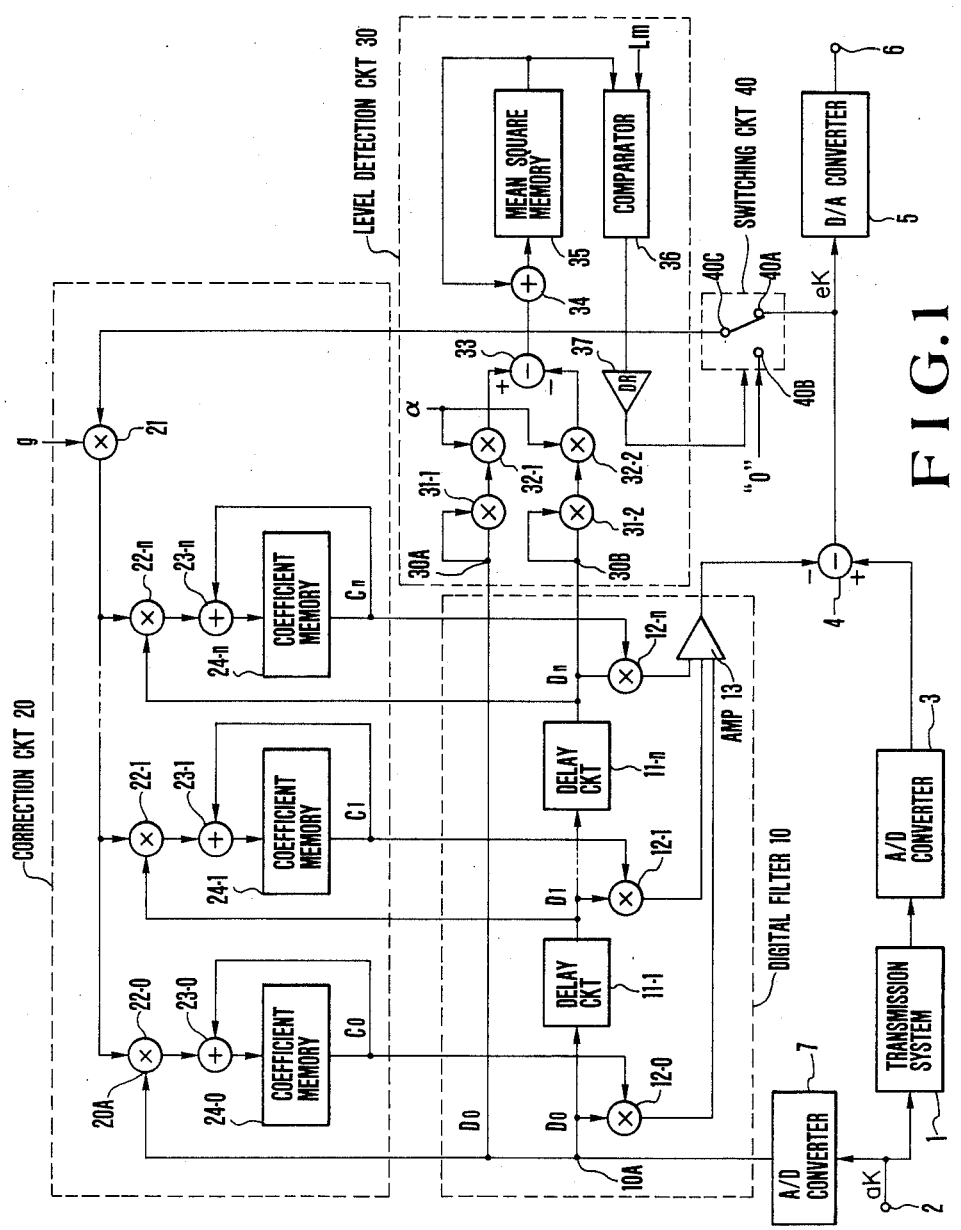
F I G. 1

ADAPTIVE DIGITAL FILTER

BACKGROUND OF THE INVENTION

The present invention relates to an adaptive digital filter for simulating indeterminate transmission characteristics of a transmission system and preventing hand-free communication singing.

Adaptive digital filters have been used to prevent singing caused by acoustic coupling upon mobile duplex communication or hand-free duplex telephone communication with a microphone and a loudspeaker. A typical adaptive digital filter used for the above purpose has the following arrangement. An input analog signal is supplied from an input terminal to a transmission system including a loudspeaker and a microphone. The transmission characteristics such as amplitude and frequency characteristics of this transmission system change in accordance with different states of acoustic coupling between the loudspeaker and the microphone and become indeterminate. An output from the transmission system is converted by an analog-to-digital (to be referred to as an A/D hereinafter) converter to a digital signal. The digital signal is supplied to one input terminal of a subtracter. The input analog signal is also converted by another A/D converter to a digital signal which is supplied to a nonrecursive digital filter having transmission characteristics similar to those of the transmission system. An output signal from the digital filter is supplied to the other input terminal of the subtracter. The subtracter calculates a difference between the output from the transmission system and the output from the digital filter. The difference signal from the subtracter serves as a signal in which the singing in accordance with the transmission characteristics of the transmission system is suppressed. The transmission characteristics of the digital filter are determined in accordance with a coefficient signal supplied from a correction circuit.

In the digital filter having the arrangement described above, when the level of the input signal exceeds an allowable input level of the A/D converter connected to the input terminal of the digital filter, the coefficient signal from the correction circuit is not normally supplied, so that the transmission characteristics of the digital filter become entirely different from those of the transmission system, resulting in an operation failure.

SUMMARY OF THE INVENTION

It is an object of the present invention to provide an adaptive digital filter which is normally operated even if an input signal level exceeds a predetermined level.

In order to achieve the above object of the present invention, there is provided an adaptive digital filter having a non-recursive digital filter which includes a series circuit of a plurality of delay circuits, receives at one end of said series circuit an input signal of a transmission system having indeterminate transmission characteristics to be compensated and mixes the sequentially corrected input signal and sequentially corrected output signals from the delay circuits to simulate the transmission system, and a correction circuit for receiving a difference signal representing a difference between an output from the digital filter and the output from the transmission system, the input signal, and the output signal from each delay circuit, and for supplying to the digital filter a signal representing a coefficient to be multiplied with the input to the series circuit and a plurality of signals each representing a coefficient to be multiplied with the output from each delay circuit, including a level detecting circuit for calculating a difference between a square of the input signal to the series circuit and a square of the output signal from the series circuit, dividing the difference by the number of delay circuits to obtain a mean value, comparing the mean value with a predetermined value, and generating a detection signal when the mean value exceeds the predetermined value, and switching circuit for causing the correction circuit to operate such that the coefficient multiplied with the input signal and the coefficient multiplied with the output signal from each delay circuit are set to be zero, in accordance with the detection signal from the level detecting means.

BRIEF DESCRIPTION OF THE DRAWINGS

FIG. 1 is a block diagram of an adaptive digital filter according to an embodiment of the present invention.

DETAILED DESCRIPTION OF THE PREFERRED EMBODIMENT

Figure 2:
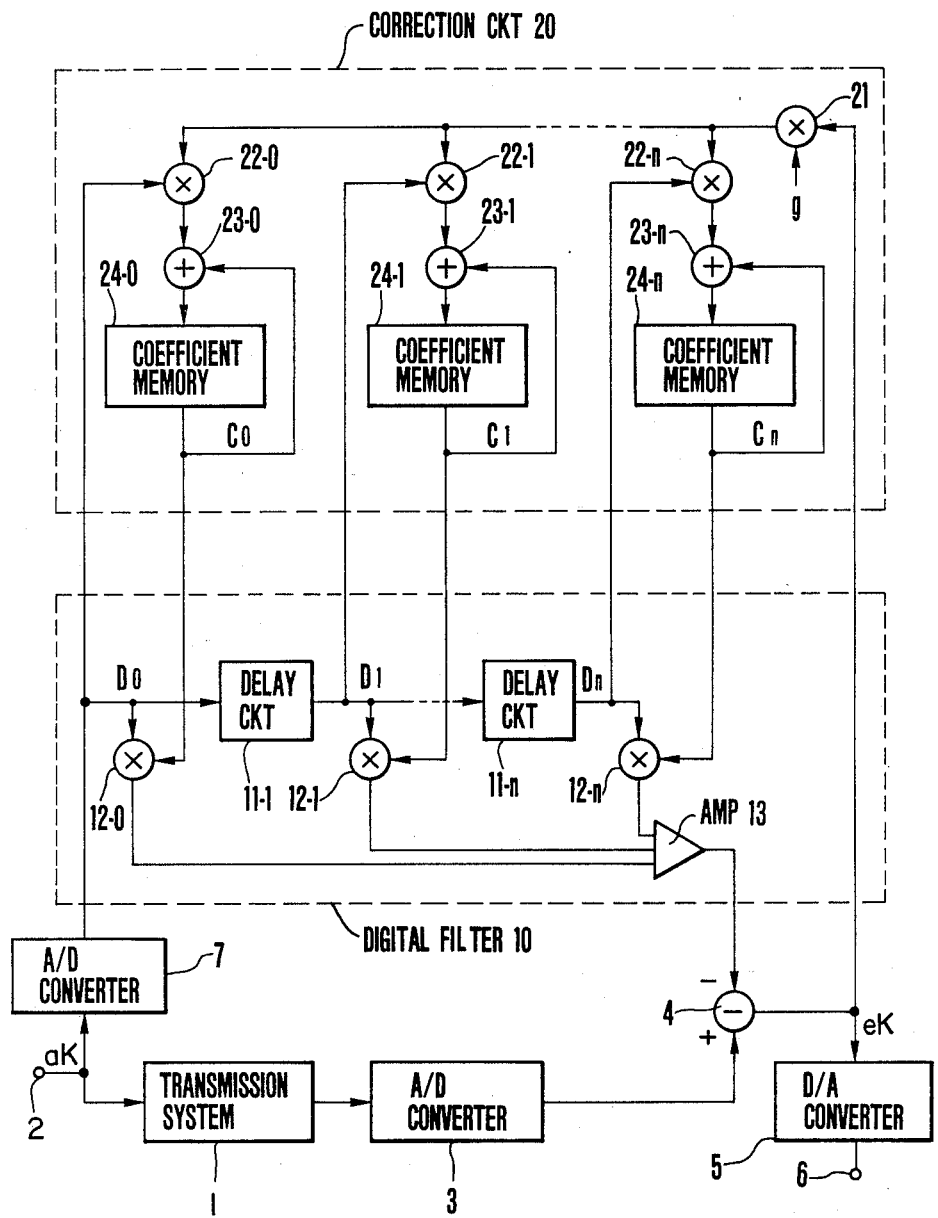
FIG. 2 is a block diagram showing an equivalent circuit of FIG. 1 when an input signal is normal.

An adaptive digital filter according to an embodiment of the present invention will be described in detail with reference to the accompanying drawings.

Referring to FIG. 1, reference numeral 1 denotes a transmission system including a hand-free telephone circuit, one terminal of which is connected to a microphone and the other terminal of which is connected to a loudspeaker. In this transmission system, an output sound from the loudspeaker is often input to the microphone after a short period of time, thus causing acoustic coupling. In this case, the same input signal is looped between the microphone and speaker while the signal is gradually attenuated, thus causing a singing phenomenon. The influence of the singing is indeterminate since the acoustic coupling state is indeterminate. Therefore, the transmission characteristics of the transmission system become indeterminate, and predetermined correction cannot compensate such indeterminate characteristics.

Reference numeral 2 denotes an analog signal input terminal of the transmission system 1. For example, a microphone input signal is supplied to the input terminal 2. An output terminal, e.g., a loudspeaker speech output signal output terminal of the transmission system 1 is connected to the input terminal of an A/D converter 3. The output terminal of the A/D converter 3 is connected to the minuend input terminal (+) of a subtracter 4.

The input terminal 2 is also connected to the input terminal of an A/D converter 7. The output terminal of the A/D converter 7 is connected to an input terminal 10A of a digital filter 10, an input terminal 20A of a correction circuit 20 and an input terminal 30A of a level detector 30.

The digital filter 10 comprises n delay circuits 11-1, ..., 11-$n$, which are series-connected, (n+1) multipliers 12-0, 12-1, ..., 12-$n$, and a mixing amplifier 13. The digital filter 10 has transmission characteristics similar to those of the transmission system 1. The input terminal of the first delay circuit 11-1 of the n series-connected delay circuits and one input terminal of the multiplier 12-0 are connected to the input terminal 10A of the digital filter 10. The output terminals of the delay circuits 11-1, ... 11-n are connected to corresponding ones of input terminals of the multipliers 12-1, ..., 12-n, respectively. The other input terminal of each of the multipliers 12-0, 12-1, ..., 12-n is connected to a corresponding one of the output terminals of (n+1) coefficient memories 24-0, 24-1, ..., 24-n in a correction circuit 20 (to be described later). The output terminals of the multipliers 12-0, 12-1, ..., 12-n are connected to the (n+1) input terminals, respectively, of the mixing amplifier 13. The output terminal of the mixing amplifier 13 is connected to the subtrahend input terminal (−) of the subtracter 4.

The output terminal of the subtracter 4 is connected to the input terminal of a digital-to-analog (to be referred to as a D/A) converter 5 and to an input terminal 40A of a switch circuit 40. The output terminal of the D/A converter 5 is connected to an output terminal 6 of the adaptive digital filter. The switch circuit 40 has another input terminal 40B for receiving a signal representing zero. In response to a control signal from the level detector 30, an output terminal 40C is controlled to select one of the signals supplied to the input terminals 40A and 40B. The output terminal 40C is connected to a multiplier 21 which multiplies the output from the switch circuit 40 with a correction gain g.

The input terminal 20A of the correction circuit 20 is connected to one input terminal of a multiplier 22-0. One input terminal of each of the n multipliers 22-1, ..., 22-n is connected to a corresponding one of the output terminals of the delay circuits 11-1, ..., 11-n in the digital filter 10. The other input terminal of each of the multipliers 22-0, ..., 22-n is connected to the output terminal of a multiplier 21. The output terminals of the multipliers 22-0, ..., 22-n are connected to corresponding ones of the input terminals of the n+1 adders 23-0, ..., 23-n, respectively. The output terminals of the adders 23-0, ..., 23-n are connected to input terminals of n+1 coefficient memories 24-0, ..., 24-n, respectively. The output terminal of the coefficient memory 24-i (where i is 0 to n) is connected to the other input terminal of the adder 23-i and to the other input terminal of the multiplier 12-i in the digital filter 10.

The output terminal of the last delay circuit 11-n in the digital filter 10 is connected to the input terminal 30B of the level detector 30. The input terminals 30A and 30B of the level detector 30 are connected to the input terminals of multipliers 31-1 and 31-2 for squaring the inputs, respectively. The output terminals of the multipliers 31-1 and 31-2 are connected to the input terminals of multipliers 32-1 and 32-2 for multiplying $\alpha$ (=1/n) with the received inputs, respectively. The output terminals of the multipliers 32-1 and 32-2 are connected to the minuend and subtrahend input terminals of a subtracter 33, respectively. The output terminal of the subtracter 33 is connected to one input terminal of an adder 34. The output terminal of the adder 34 is connected to the input terminal of a mean square memory 35 whose output terminal thereof is connected to the other input terminal of the adder 34 and one input terminal of a comparator 36. The other input terminal of the comparator 36 receives a signal representing a predetermined value Lm. The output terminal of the comparator 36 is connected to the control terminal of the switch circuit 40 through a driver 37.

The operation of the adaptive digital filter having the arrangement shown in FIG. 1 will be described hereinafter. FIG. 2 shows an equivalent circuit of FIG. 1 when the output terminal 40C of the switch circuit 40 is connected to the input terminal 40A, and also shows the adaptive digital filter which has been utilized in the related art. Referring to FIG. 2, assume that a magnitude of the analog input signal, a proper coefficient, and an input signal from the input terminal 2 are given as a, K and aK. The input signal aK is supplied to the transmission system 1 whose output signal is converted by the A/D converter 3 and the digital signal serves as a minuend in the subtracter 4. The input signal aK is converted by the A/D converter 7 at a predetermined sampling period. The sampled data is supplied to the delay circuit 11-1. This digital data is given as D0, and the output signals from the delay circuits 11-1, ..., 11-n are given as D1, ..., Dn respectively. The respective signals Di (i=0 to n) are multiplied by the multipliers 12-0, ... 12-n with the coefficient signals C0, C1, ..., Cn from the coefficient memories 24-0, ..., 24-n in the correction circuit 20. The products are mixed and amplified by the mixing amplifier 13 and serve as a subtrahend in the subtracter 4. The subtracter 4 performs a subtraction and generates a difference signal eK. The difference signal eK is multiplied by the multiplier 21 in the correction circuit 20 with the correction gain g. The products are multiplied by the multipliers 22-0, ..., 22n with the input signal D0 and the delayed signals Dj (j=1 'to n). The respective outputs from the multipliers 22-0, ..., 22-n are added to the current contents Cj (j=0 to n) of the coefficient memories 24-0, ..., 24-n, respectively, thus updating the coefficients Cj. The above operation is performed in units of sampling periods of the A/D converter 7, so that the coefficients Cj are sequentially corrected. The sequential correction algorithm can be given as follows:

$$C_j^{(\nu+1)} = C_j^{(\nu)} + g \cdot eK \cdot Dj \tag{1}$$

where $\nu$ is the sampling order of the A/D converter 7. When the level of the input signal aK exceeds an allowable input level of the A/D converter 7, the output of the converter 7 cannot correspond to the input signal. In this case, the input value of the digital filter 10 does not correspond to the input level of the transmission system 1. Errors occurs in eK and Dj in equation (1) and are sequentially accumulated in the coefficient memories 24-0, ..., 24-n. As a result, the coefficient memories overflow, and the coefficients Cj become indeterminate. Once a divergence state as described above occurs, the coefficients C0 to Cn cannot be corrected to the optimal values even if the level of the input signal is restored to the normal level. The transmission characteristics of the digital filter 10 are thus entirely different from those of the transmission system 1.

The above problem is not limited to the arrangement of FIG. 1 and the algorithm of equation (1). In any sequential correction scheme for adding a correction value to the coefficient at a specific time, the above problem must occur.

The operation of the level detector 30 in the circuit of FIG. 1 will be described hereinafter. The multipliers 31-1 and 31-2 receive the input signal D0 of the first delay circuit 11-1 and the output signal Dn of the last delay circuit 11-n, respectively. The signals D0 and Dn are squared to produce $D0^2$ and $Dn^2$. The products $D0^2$ and $Dn^2$ are multiplied by the multipliers 32-1 and 32-2 with $\alpha(=1/n)$ to obtain $\alpha \cdot D0^2$ and $\alpha \cdot Dn^2$. These signals are subjected to a subtraction in the subtracter 33. A difference signal from the subtracter 33 is added to the output from the mean square memory 35. The sum sequentially updates the contents of the mean square memory 35. The updating algorithm is given as follows:

$$a \cdot \Sigma Di + 1^2 = a \cdot \Sigma Di^2 + (a \cdot D0^2 - a \cdot Dn^2) \quad (2)$$

where i represents the specific one of the contents of the mean square memory 35 at a specific time.

The contents of the mean square memory 35 are the same as the values obtained by integrating the square of the input signal Di. In accordance with the operation of the subtracter 33 the contents of the mean square memory 35 increase when the input signal level is increased, decrease when the input signal level is decreased, and is held constant when the input signal level is held constant. The output from the mean square memory 35 is supplied to the comparator 36 and is compared with the predetermined value Lm. When the comparator 36 detects that the output of the mean square memory 35 exceeds the predetermined value Lm, the switch circuit 40 is driven through the driver 37 in response to the detection signal from the comparator 36. The output signal eK supplied to the multiplier 21 in the correction circuit 20 is switched by the switch circuit 40 to a signal of logic "0". Since eK becomes "0", equation (1) can be rewritten as follows:

$$Cj^{(\nu+1)} = Cj^{(\nu)}$$

The correction circuit 20 stops correcting the coefficients C0 to Cn and holds the immediately preceding coefficients $Cj^{(\nu)}$, so that the influence of the excessively high level of the input signal aK can be prevented. When the input signal level is restored to the normal level, the switch circuit 40 is restored, and the correction circuit 20 starts correction.

When the predetermined value Lm is properly selected, the level of the input signal aK for inhibiting coefficient correction can be arbitrarily set.

It should be noted that the same effect as in the above embodiment can be obtained even if the switch circuit 40 is connected to the output terminal of the multiplier 21 or input terminals of the coefficient memories 24-0, . . . , 24-n. The transmission system 1 is exemplified by a system consisting of a microphone and a loudspeaker. However, the transmission system 1 may comprise any transmission system which requires compensation due to indeterminate transmission characteristics.

As described above, the adaptive digital filter of the present invention, by addition of simple circuits to the conventional one, prevents an operation failure caused by correction coefficient divergence even if the input level exceeds the predetermined value Lm and can be effectively used in a variety of applications.

What is claimed is:

1. An adaptive digital filter having a nonrecursive digital filter which includes a series circuit of a plurality of cascade-connected delay circuits, receives an input signal of a transmission system to be compensated at one end of said series circuit, and mixes the input signal and output signals from said plurality of delay circuits to simulate the transmission characteristics of said transmission system, and a correction circuit adapted to receive a difference signal representing a difference between an output signal from said nonrecursive digital filter and an output signal from said transmission system, or a zero signal representing zero, for receiving the input signal and an output signal from each of said plurality of delay circuits, and for supplying to said digital filter a plurality of signals for sequentially correcting the input signal and the output signals from said plurality of delay circuits, comprising level detecting means for calculating a difference between a square of the input signal to said series circuit and a square of the output signal from said series circuit, dividing the difference by the number of delay circuits to obtain a mean value, comparing the mean value with a predetermined value, and generating a detection signal when the mean value exceeds the predetermined value, and switching means for supplying said correction circuit with said difference signal or said zero signal when said detection signal is not or is generated from said level detecting means, respectively.

2. A filter according to claim 1, wherein said level detecting means comprises: two square circuits for squaring the input signal and the output signal of said series circuit, respectively; multipliers for multiplying square values from said square circuits with an inverse number of the number of said plurality of delay circuits; a subtracter for calculating a difference between outputs from said multipliers; mean square memories whose contents are updated in response to an output from said subtracter; and a comparator for comparing an output from each of said mean square memories with the predetermined value.

3. A filter according to claim 1, wherein said switching means is controlled in response to said detection signal for switching an input to said correction circuit to a signal representing zero from the difference signal representing the difference between the outputs from said nonrecursive digital filter and said transmission system.

* * * * *